(12) United States Patent
Knauss et al.

(10) Patent No.: US 8,705,776 B2
(45) Date of Patent: Apr. 22, 2014

(54) MICROPHONE PACKAGE AND METHOD FOR MANUFACTURING SAME

(75) Inventors: Michael Knauss, Pfullingen (DE); Scott Naugle, Venetia, PA (US); Andy Doller, Sharpsburg, PA (US); Eric Ochs, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 273 days.

(21) Appl. No.: 13/306,017

(22) Filed: Nov. 29, 2011

(65) Prior Publication Data

US 2012/0148083 A1   Jun. 14, 2012

(30) Foreign Application Priority Data

Dec. 13, 2010   (DE) .......................... 10 2010 062 887

(51) Int. Cl.
*H04R 1/02* (2006.01)
*H04R 19/00* (2006.01)
*H04R 19/04* (2006.01)
*H04R 1/28* (2006.01)

(52) U.S. Cl.
CPC .............. *H04R 19/005* (2013.01); *H04R 19/04* (2013.01); *H04R 1/2807* (2013.01)
USPC .......................................... 381/175; 381/369

(58) Field of Classification Search
USPC .......... 381/355–361, 369, 175; 257/704, 729, 257/730; 438/51, 53, 121, 123
See application file for complete search history.

(56) References Cited

U.S. PATENT DOCUMENTS

| | | | |
|---|---|---|---|
| 2005/0069164 A1* | 3/2005 | Muthuswamy et al. | 381/369 |
| 2009/0129622 A1* | 5/2009 | Chen et al. | 381/369 |
| 2009/0180655 A1 | 7/2009 | Jiung-Yue et al. | |
| 2010/0246877 A1* | 9/2010 | Wang et al. | 381/361 |
| 2011/0198714 A1* | 8/2011 | Yang | 257/416 |

FOREIGN PATENT DOCUMENTS

| | | |
|---|---|---|
| DE | 695 35 266 | 1/2007 |
| WO | WO 2007/054070 | 5/2007 |
| WO | WO 2010/084236 | 7/2010 |

* cited by examiner

*Primary Examiner* — Tuan D Nguyen
(74) *Attorney, Agent, or Firm* — Kenyon & Kenyon LLP

(57) ABSTRACT

A System and method to provide a cost-effective implementation of a microphone package, very good microphone performance being achieved even with a high degree of miniaturization. A microphone package includes a MEMS microphone component having a microphone diaphragm, and a housing having a housing base and a housing cover, the housing enclosing the back-side volume of the microphone component, and an acoustic access channel to the microphone diaphragm being provided in the housing which is closed off with respect to the back-side volume and which connects at least one sound opening in the housing to one side of the microphone diaphragm. An interposer is mounted inside the housing which defines the acoustic access channel to the microphone diaphragm in that the interposer is coupled to the sound opening in the housing, and has at least one exit opening above which the microphone component together with the microphone diaphragm is mounted.

5 Claims, 4 Drawing Sheets

MICROPHONE PACKAGE AND METHOD FOR MANUFACTURING SAME

RELATED APPLICATION INFORMATION

The present application claims priority to and the benefit of German patent application no. 10 2010 062 887.5, which was filed in Germany on Dec. 13, 2010, the disclosure of which is incorporated herein by reference.

FIELD OF THE INVENTION

The present invention relates to a microphone package and a method for manufacturing same. The microphone package in question includes at least one MEMS microphone component having a microphone diaphragm, and a housing having a housing base and a housing cover. The housing encloses the back-side volume of the microphone component. In addition, an acoustic access channel to the microphone diaphragm is provided in the housing which is closed off with respect to the back-side volume and which connects a sound opening in the housing to one side of the microphone diaphragm.

BACKGROUND INFORMATION

The packaging of MEMS components has several different functions. The packaging protects the component from mechanical and chemical environmental influences. In addition, the type of packaging or housing determines how the component may be installed and contacted at the site of use. In this regard, housings for surface mounting technology (SMT) installation are of particular importance. In the case of a MEMS microphone component, the housing also takes over a portion of the microphone functionality, since the acoustic connection as well as the back-side volume of the microphone diaphragm are largely determined by the design of the housing. Therefore, the housing has a significant influence on the transmission characteristics of a MEMS microphone.

United States Published Patent Application No. 2009/0180655 A1 discusses a microphone package of the type mentioned at the outset. The microphone package includes a MEMS microphone component having a housing composed of a housing base and a housing cover. The housing base and housing cover are connected to one another in a pressure-tight manner, and thus enclose the back-side volume of the microphone component, which is mounted on the housing base. Sound is conducted to the microphone diaphragm from below. For this purpose, the microphone component is mounted in a pressure-tight manner above the exit opening of an access channel in the housing base. Sound is introduced via a tubular connector in the housing cover which opens into the access channel in the housing base.

This design requires a specially produced, relatively thick housing base, which as a whole is comparatively costly. In addition, in this case good microphone performance may be ensured only if the entry opening and the exit opening of the access channel as well as the vertical extension of the access channel are relatively large. As a result, the options for miniaturizing the known microphone package are limited.

SUMMARY OF THE INVENTION

The exemplary embodiments and/or exemplary methods of the present invention provide measures which allow cost-effective implementation of a microphone package of the type discussed here, very good microphone performance being achieved even with a high degree of miniaturization.

This is achieved according to the exemplary embodiments and/or exemplary methods of the present invention with the aid of an intermediate carrier, referred to as an interposer, which is mounted inside the housing and which defines the acoustic access channel to the microphone diaphragm in that the intermediate carrier is coupled to the sound opening in the housing, and has at least one exit opening above which the microphone component together with the microphone diaphragm is mounted.

According to the exemplary embodiments and/or exemplary methods of the present invention, instead of the relatively complicated production of a thick housing base having an access channel which extends in parallel to the base surface, two independent manufacturing steps are carried out, namely, the structuring and shaping of an intermediate carrier, and the aligned installation of this intermediate carrier inside the housing.

According to the exemplary embodiments and/or exemplary methods of the present invention, use is made of the fact that the intermediate carrier may be manufactured of a completely different material than the housing base, and that when the material is suitably selected, standard processes may be used for preparing the interposer and mounting it in the housing. In addition to the cost advantage of this procedure compared to the single-part variant of the related art, with the aid of the interposer according to the present invention the geometric dimensions of the access channel, and therefore its acoustic properties, may also be specified much more precisely. This opens the possibility for extensive miniaturization of the entire microphone package.

In principle, there are various options for implementing a microphone package according to the present invention, in particular with regard to the material, shape, structure, and installation of the interposer.

In one embodiment of the exemplary embodiments and/or exemplary methods of the present invention, the interposer is implemented in the form of a flat intermediate carrier having a peripheral convexly curved edge region, and is connected to the housing base in a pressure-tight manner via this convexly curved edge region. The interposer together with the housing base thus forms the acoustic access channel. In this case, the exit opening in the acoustic access channel may be easily implemented in the form of a passage opening in the intermediate carrier. The entry opening in the access channel may likewise be a passage opening in the interposer, or may also be a passage opening in the housing base. However, the entry opening may also be provided, for example, at the side between the housing base and the interposer.

With regard to an SMT installation of the microphone package, it has proven to be advantageous for the sound opening to be located in the area of the housing cover. In one specific embodiment of the present invention, the open end of an inwardly directed connector in the housing cover functions as a sound opening. With the aid of the connector, the conduction of sound is separated from the back-side volume by mounting the connector above the entry opening in the acoustic access channel in the interposer and connecting the connector to the interposer in a pressure-tight manner. The sound is thus conducted to the microphone diaphragm via the connector and the sound opening in the housing cover and through the access channel between the interposer and the housing base.

In one particularly advantageous variant of the microphone package according to the present invention which is also suitable for use in a particle-containing environment, a grid-like filter structure is present in the area of the entry opening in the acoustic access channel. Particles may thus be prevented, in an extremely effective manner, from depositing on the microphone diaphragm and thus distorting the microphone signal.

As previously mentioned, the interposer may be manufactured of various materials. In one variant of the exemplary embodiments and/or exemplary methods of the present invention, the microphone package includes a metallic interposer. An interposer of this type may advantageously be made of the same material, and using the same techniques as for a leadframe, and may also be mounted on the housing base using standard processes such as reflow soldering, for example. With the aid of the structuring processes which are usually used in leadframe manufacture, very small structures having very precise dimensions may be implemented. This is particularly important in the production of the sound entry opening and sound exit opening as well as a grid-like filter structure in the area of these openings, and is a prerequisite for the miniaturization of the microphone package. The wall thickness of the interposer may be greatly reduced by using metal instead of plastic. In addition, the metallic interposers produced in this way have higher dimensional accuracy than plastic interposers, which are usually produced in the injection molding process. Thus, with regard to the surface area as well as the height, smaller microphone packages may be implemented using metallic interposers compared to plastic interposers.

Another important advantage of metallic interposers is that they may be produced very easily in large numbers in the form of a consolidated array and mounted on a corresponding array of housing bases. This greatly simplifies the manufacture of microphone packages according to the present invention, as explained in greater detail below with reference to the figures.

As previously described, there are various options for advantageously embodying and refining the teaching of the present invention. To this end, on the one hand reference is made to the further descriptions herein, and on the other hand, to the following description of one exemplary embodiment of the present invention, with reference to the figures.

The following figures illustrate the manufacture of a plurality of microphone packages according to the present invention.

DETAILED DESCRIPTION

Figure 1:
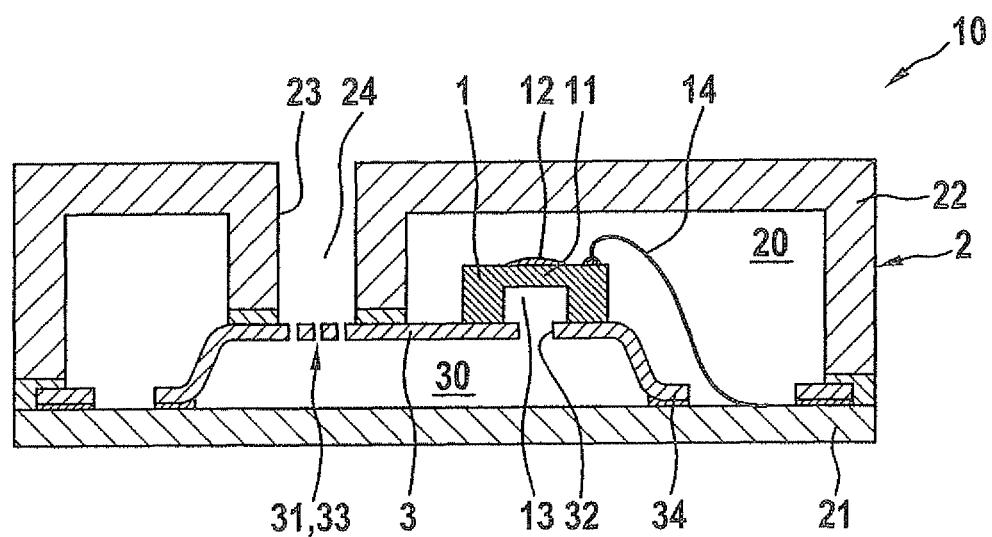
FIG. 1 shows a schematic sectional view of a microphone package according to the present invention.

FIG. 1 illustrates a microphone package 10 having a MEMS microphone component 1. A diaphragm 11 having circuit elements 12 for signal detection is provided in the top side of MEMS microphone component 1. Microphone diaphragm 11 is acted on by acoustic pressure via a cavern 13 in the back side of the component.

MEMS microphone component 1 is situated in a housing 2 which is essentially composed of a housing base 21 and a housing cover 22. Housing base 21 and housing cover 22 are connected to one another in a pressure-tight manner, and form back-side volume 20 for microphone diaphragm 11. An inwardly directed connector 23 having a sound opening 24 is provided in housing cover 22.

According to the exemplary embodiments and/or exemplary methods of the present invention, microphone package 10 also includes an intermediate carrier, referred to as an interposer 3. The intermediate carrier together with housing base 21 forms an acoustic access channel 30 for microphone component 1 which connects sound opening 24 in housing cover 22 to cavern 13 beneath microphone diaphragm 11, and which at the same time is closed off with respect to back-side volume 20.

According to one specific embodiment of the present invention, interposer 3 is implemented in the form of a metallic carrier part which, on the basis of a leadframe material, has been structured and shaped using leadframe manufacturing processes such as punching, etching, and deep drawing. An entry opening 31 and an exit opening 32 have been produced in interposer 3. A mesh-like filter structure 33 is provided in the opening area of entry opening 31. Structures of this fine type may be advantageously implemented by etching the leadframe material. In addition, edge region 34 of interposer 3 has been convexly curved. Interposer 3 is mounted on housing base 21, and is connected to the housing base in a pressure-tight manner via its convexly curved edge region 34. Furthermore, connector 23 of housing cover 22 having sound opening 24 above entry opening 31 is connected in a pressure-tight manner to interposer 3. Depending on the material of housing parts 21 and 22, the connection to metallic interposer 3 may be easily established by gluing or soldering. Microphone component 1 is likewise mounted on interposer 3 in a pressure-tight manner, specifically with cavern 13 above exit opening 32.

With the aid of interposer 3 it is ensured that sound is conducted solely on the back side of microphone diaphragm 11. The sound enters acoustic access channel 30 between interposer 3 and housing base 21 via connector 23 and sound opening 24 in housing cover 22, and via entry opening 31 in interposer 3. This access channel 30 is closed off with respect to back-side volume 20, so that the acoustic pressure is conducted solely through exit opening 32 to cavern 13, and therefore on the bottom side of microphone diaphragm 11. Filter structure 33 in the opening area of entry opening 31 is designed to prevent dirt particles from entering acoustic access channel 30 and reaching microphone diaphragm 11 and settling there.

Back-side volume 20 is closed off above microphone diaphragm 11, which not only benefits the acoustic properties of the microphone, but also protects circuit elements 12 on microphone diaphragm 11, together with bonding wires 14 for electrically contacting circuit elements 12, against environmental influences.

The above-described design of microphone package 10 is particularly suited for mass production using standard assembly and connection technology (ACT) processes for MEMS components. This is explained below with reference to FIGS. 2a through 2f.

Arrays of the microphone package components, interposers, housing bases, and housing covers of the microphone package are initially produced independently of one another, but in a mutually coordinated manner with respect to grid size and shape and configuration of the function elements.

Figure 2A:
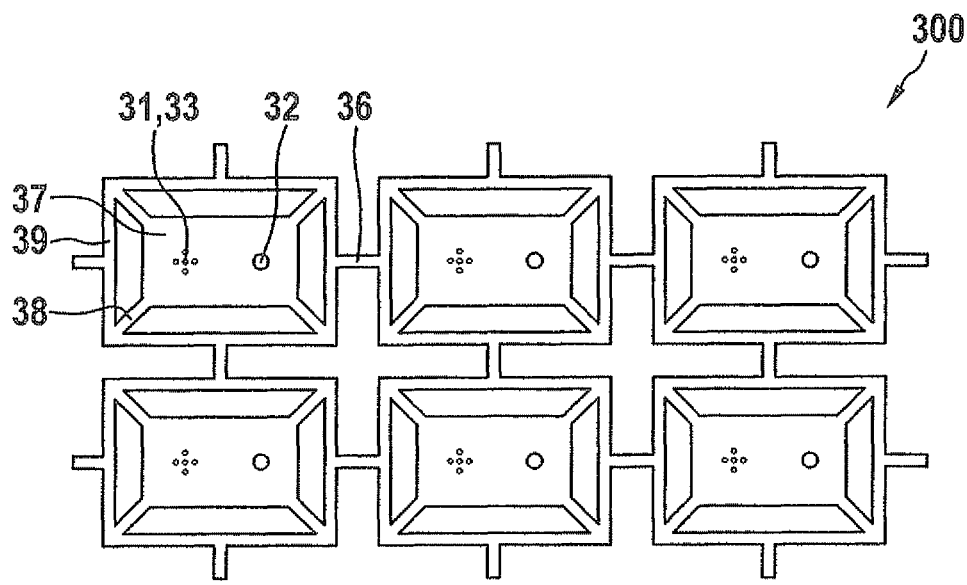
FIG. 2a shows an interposer array.

Interposer array 300 is illustrated in FIG. 2a. This is a Cu leadframe from which a grid of interposers 3 has been punched, so that the individual interposers 3 are connected to one another solely via connecting webs 36. Each interposer 3 is composed of a rectangular middle part 37 having a grid-like filter structure 33 in the area of entry opening 31, and having an exit opening 32. Middle part 37 is connected to a rectangular frame 39 via webs 38 situated in the corners of the frame. Edge region 34 of middle part 37 together with frame 39 has been convexly curved in a deep-drawing process. Interposer array 300 may also be coated with a noble metal as corrosion protection and to improve the adhesiveness, for example using a currentless NiPdAu electroplating process, similarly as for preplated leadframes.

Figure 2B:
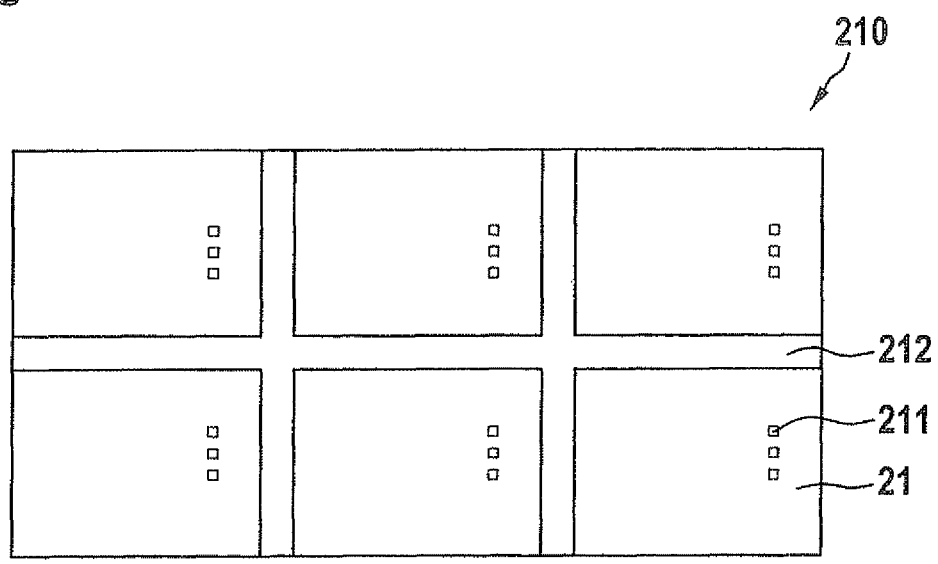
FIG. 2b shows a housing base array.

For housing bases 21, a substrate material 210 is made available and provided with contact surfaces 211 for electrically contacting the microphone components. An array 210 of housing bases 21 prepared in this way is illustrated in FIG. 2b. In addition to contact surfaces 211 for the microphone components, housing base array 210 has an additional contact surface 212 which extends peripherally in the grid, i.e., in each edge region of individual housing bases 21. These contact surfaces 212 are used to electrically connect housing covers 22, which in each case are mounted on the edge of a housing base.

Figure 2C:
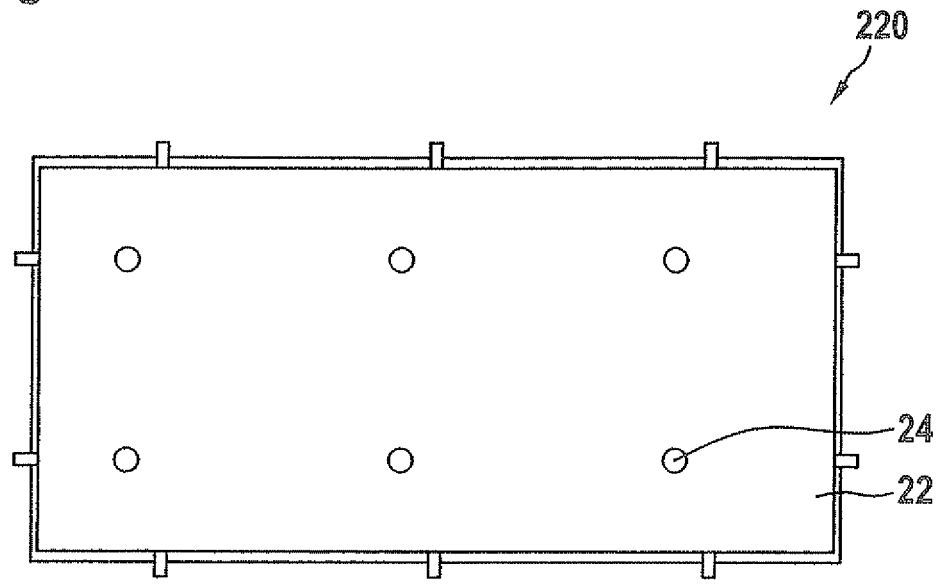
FIG. 2c shows a housing cover array.

Housing covers 22 are also produced here in the form of a consolidated array 220, for example as a molded plastic part. A housing cover array 220 of this type is illustrated in FIG. 2c. This figure shows that connectors 23 together with sound openings 24 are situated in interposer array 300 with respect to entry openings 31.

Figure 2D:
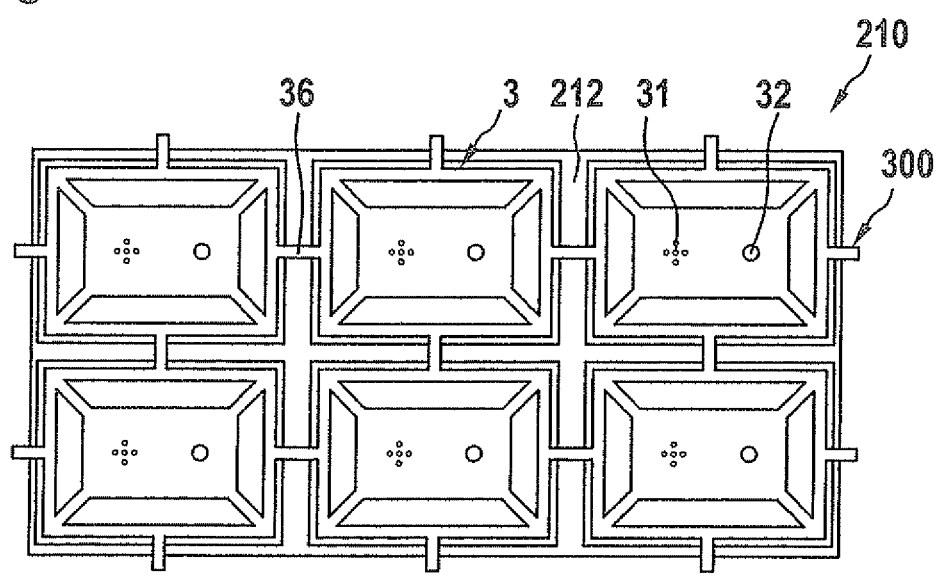
FIG. 2d shows the housing base array after the interposer array has been mounted.

For the assembly of the microphone packages, interposer array 300 is initially mounted in alignment on prepared substrate material 210 so that frame 39 of each interposer 3 rests completely on a housing base 21, and peripheral contact surface 212 remains free except for connecting webs 38. This configuration is illustrated in FIG. 2d. The mechanical connection as well as a possible electrical connection between interposer array 300 and substrate material 210 may be easily established with the aid of a suitable adhesive, or by soldering. The adhesive or the solder paste may be applied either to interposer array 300 or to substrate material 210. Adhesive or also solder paste may be advantageously applied either by dispensing or in a screen printing process.

Figure 2E:
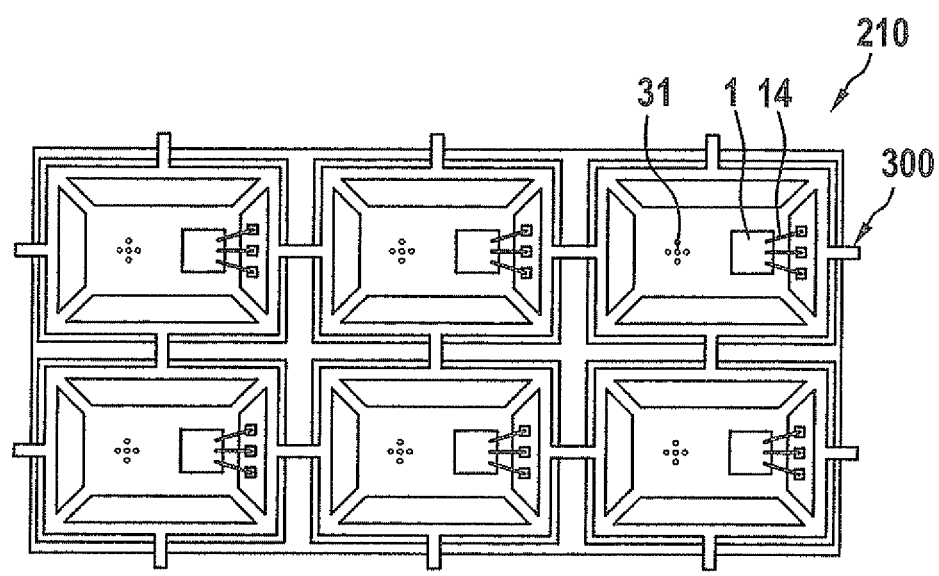
FIG. 2e shows the design in FIG. 2d after microphone chips have been installed.

MEMS microphone components 1 are generally manufactured in parallel in large numbers, and are separated only for the mounting on interposer 3. Microphone components 1 are each situated above exit opening 32 of an interposer 3, and are connected thereto in a pressure-tight manner, by gluing, for example. FIG. 2e shows this design after the electrical connections between the microphone components and corresponding contact surfaces 211 on housing base 21 have been established with the aid of bonding wires 14.

Figure 2F:
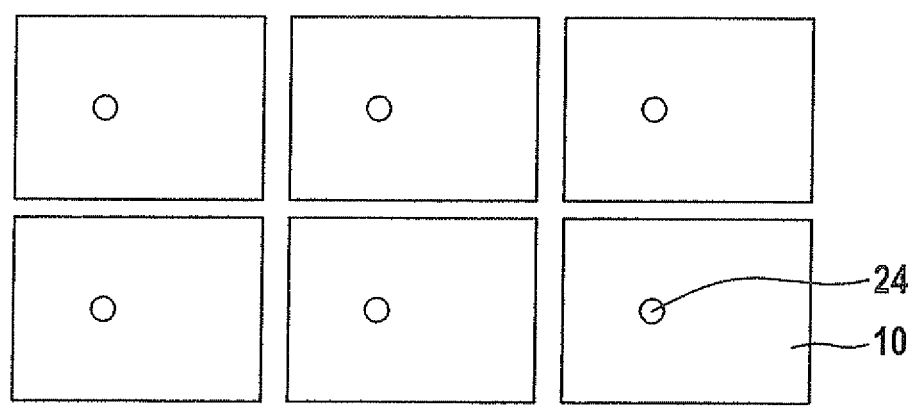
FIG. 2f shows the design in FIG. 2e after the housing cover array has been mounted and the microphone packages have been separated.

Lastly, housing cover array 220 is also mounted and connected in a pressure-tight manner to housing base array 210 in the area of contact surface 212 which extends peripherally in the grid. Connectors 23 together with sound openings 24 are each situated above entry opening 31 of an interposer 3, and are likewise connected thereto in a pressure-tight manner. For this purpose, an adhesive is advantageously applied to the housing cover array by screen printing. Only then are the microphone packages separated by severing the entire structure along the grid lines. This is illustrated by FIG. 2f.

What is claimed is:

1. A microphone package, comprising: one MEMS microphone component having a microphone diaphragm; one housing having a housing base and a housing cover, the housing enclosing the back-side volume of the microphone component, wherein an acoustic access channel to the microphone diaphragm is provided in the housing which is closed off with respect to the back-side volume and which connects at least one sound opening in the housing to one side of the microphone diaphragm; and an interposer, which is mounted inside the housing and which defines the acoustic access channel to the microphone diaphragm in that the interposer is coupled to the sound opening in the housing, and has at least one exit opening above which the microphone component together with the microphone diaphragm is mounted; wherein the interposer is configured as an essentially flat intermediate carrier having a peripheral convexly curved edge region, and wherein the interposer is connected to the housing base via its convexly curved edge region in a pressure-tight manner so that together with the housing base it forms the acoustic access channel, and at least the exit opening in the acoustic access channel is configured as a passage opening in the interposer.

2. The microphone package of claim 1, wherein an inwardly directed connector having a sound opening is provided in the housing cover, the at least one entry opening in the acoustic access channel is configured as a passage opening in the interposer, and the connector of the housing cover is mounted above the entry opening in a pressure-tight manner.

3. The microphone package of claim 2, wherein a grid-like filter structure is provided in the entry opening in the acoustic access channel.

4. The microphone package of claim 1, wherein the interposer is configured as a structured and shaped metallic carrier part having a peripheral convexly curved edge region.

5. The microphone package of claim 4, wherein the metallic interposer is one of glued and soldered to the housing base.

* * * * *